US008593058B2

(12) United States Patent
Choi et al.

(10) Patent No.: US 8,593,058 B2
(45) Date of Patent: Nov. 26, 2013

(54) ORGANIC LIGHT-EMITTING DISPLAY DEVICE

(75) Inventors: Jin-Baek Choi, Yongin (KR); Won-Jong Kim, Yongin (KR); Ji-Young Choung, Yongin (KR); Joon-Gu Lee, Yongin (KR); Yeon-Hwa Lee, Yongin (KR); Young-Woo Song, Yongin (KR); Jong-Hyuk Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 122 days.

(21) Appl. No.: 13/317,650

(22) Filed: Oct. 25, 2011

(65) Prior Publication Data
US 2012/0268000 A1 Oct. 25, 2012

(30) Foreign Application Priority Data

Apr. 20, 2011 (KR) .................. 10-2011-0036856

(51) Int. Cl.
*H05B 33/14* (2006.01)
(52) U.S. Cl.
USPC .......................................... 313/504; 313/506
(58) Field of Classification Search
None
See application file for complete search history.

(56) References Cited

U.S. PATENT DOCUMENTS

| 5,405,710 | A | * | 4/1995 | Dodabalapur et al. ......... 428/690 |
| 7,605,535 | B2 | * | 10/2009 | Kobayashi .................... 313/506 |
| 2005/0017630 | A1 | * | 1/2005 | Ryu et al. ...................... 313/504 |
| 2005/0140277 | A1 | * | 6/2005 | Suzuki et al. ................. 313/504 |
| 2007/0159071 | A1 | * | 7/2007 | Lee et al. ...................... 313/504 |
| 2008/0111474 | A1 | * | 5/2008 | Sung et al. .................... 313/504 |
| 2011/0169399 | A1 | * | 7/2011 | Ito et al. ........................ 313/504 |

FOREIGN PATENT DOCUMENTS

| JP | 2008-171637 | * | 7/2008 |
| KR | 10-2001-0057124 A | | 7/2001 |
| KR | 10-2006-0094160 A | | 8/2006 |
| KR | 10-2007-0014893 A | | 2/2007 |
| KR | 10-0838088 B1 | | 6/2008 |

* cited by examiner

*Primary Examiner* — Ashok Patel
(74) *Attorney, Agent, or Firm* — Lee & Morse, P.C.

(57) ABSTRACT

An organic light-emitting display device includes an anode electrode, an organic layer on the anode electrode, the organic layer having an emission layer, and a cathode electrode on the organic layer through which light emitted from the emission layer of the organic layer passes, wherein a thickness of the cathode electrode in a first region is different from a thickness of the cathode electrode in a second region.

21 Claims, 2 Drawing Sheets

ORGANIC LIGHT-EMITTING DISPLAY DEVICE

BACKGROUND

1. Field

Embodiments relate to an organic light-emitting display device.

2. Description of the Related Art

Organic light-emitting display devices, which are next-generation display devices having self light-emitting characteristics, have better characteristics than liquid crystal display devices in terms of viewing angle, contrast, response speed, and power consumption. In addition organic light-emitting display devices can be manufactured to be thin and light-weight, since a backlight is not required.

An organic light-emitting display device may include an anode, an organic layer and a cathode stacked sequentially on a substrate having pixel circuits such as thin-film transistors. Types of light emission may largely be divided into a top emission structure or a bottom emission structure according to the direction of light emission. In the top emission structure, an image is realized in a direction in which the organic light-emitting display device is formed, that is, in the direction of the cathode opposite to the direction of the substrate. The top emission structure ensures a higher aperture ratio than the bottom emission structure in which an image is realized in the direction of the substrate. Accordingly, higher light-emitting efficiency can be achieved in the top emission structure.

In the case of the top emission structure, the cathode formed at the top of the organic light-emitting display device must be transparent. However, there is a limit to forming a transparent cathode. That is, as a basic requirement, the cathode must have a lower work function than the anode. However, materials that meet the low work function requirement are mostly materials (such as metal) having low light transmittance. A conventional transparent cathode is formed of a thin film of metal having a low work function. However, since the light transmittance of the conventional transparent cathode is very low, there is a limit to improving light efficiency. Accordingly, various research is being conducted on a method of improving light transmittance.

SUMMARY

According to one or more embodiments, an organic light-emitting display device may include an anode electrode, an organic layer on the anode electrode, the organic layer having an emission layer, and a cathode electrode on the organic layer through which light emitted from the emission layer of the organic layer passes, wherein a thickness of the cathode electrode in a first region is different from a thickness of the cathode electrode in a second region.

The cathode electrode may include a common cathode electrode covering all of the anode electrode and the organic layer, and a plurality of partial cathode electrodes between the common cathode electrode and the organic layer. The common cathode electrode may have a uniform thickness throughout the pixel regions. The partial cathode electrodes in at least two of the pixel regions may have different thicknesses.

The organic light-emitting display device may further include a substrate having a plurality of pixel regions, wherein the anode electrode is patterned to correspond to each of the plurality of pixel regions, and each of the partial cathode electrodes corresponds to a respective pixel region.

The organic light-emitting display device may further include a substrate having a plurality of pixel regions, wherein the cathode electrode has different thicknesses in at least two of the plurality of pixel regions. The pixel regions may include first through third pixel regions, wherein the cathode electrode has a first thickness in the first pixel region, a second thickness in the second pixel region, and a third thickness in the third pixel region, wherein the first through third thicknesses are different. The thickness of the cathode electrode formed in each pixel region may be determined based on a wavelength of light that passes through the cathode electrode and transmittance of the light that passes through the cathode electrode. The transmittance of the light that passes through the cathode electrode in each pixel region may be 85% or higher.

The organic layer may have different thicknesses in at least two of the pixel regions. The organic layer may have a uniform thickness throughout the plurality of pixel regions. The organic layer may further include a hole injection layer and a hole transport layer between the emission layer and the anode electrode and an electron transport layer, and an electron injection layer between the emission layer and the cathode electrode, wherein the hole injection layer, the hole transport layer, the electron transport layer, and the electron injection layer, each have a thickness that is the same in the at least two of the plurality of pixel regions.

According to one or more embodiments, an organic light-emitting display device may include a substrate in which a plurality of pixel regions are defined, an anode electrode on the substrate, an organic layer on the anode electrode and having an emission layer, and a cathode electrode on the organic layer (through which light emitted from the emission layer of the organic layer passes), wherein the cathode electrode has different thicknesses in at least two of the pixel regions.

The anode electrode may be patterned to correspond to each of the plurality of pixel regions. The cathode electrode may include a plurality of partial cathode electrodes corresponding to a respective pixel region. A common cathode may be electrically connected to the partial cathode electrodes. The common cathode electrode may have a uniform thickness throughout the plurality of pixel regions.

The pixel regions may include a first through third pixel regions, wherein the cathode electrode has a first thickness in the first pixel region, a second thickness in the second pixel region, and a third thickness in the third pixel region, wherein the first through third thicknesses are different. The thickness of the cathode electrode in each pixel region may be determined based on a wavelength of light that passes through the cathode electrode and transmittance of the light that passes through the cathode electrode. The transmittance of the light that passes through the cathode electrode in each pixel region may be 85% or higher. The organic layer may have different thicknesses in at least two of the pixel regions. The organic layer may have a uniform thickness throughout the plurality of pixel regions.

The organic layer may include a hole injection layer and a hole transport layer between the emission layer and the anode layer, and an electron transport layer and an electron injection layer between the emission layer and the cathode electrode, wherein the hole injection layer, the hole transport layer, the electron transport layer, and the electron injection layer, each have a thickness that is the same in the at least two of the plurality of pixel regions.

BRIEF DESCRIPTION OF THE DRAWINGS

The embodiments will become more apparent by describing in detail exemplary embodiments thereof with reference to the attached drawings, in which.

DETAILED DESCRIPTION

Korean Patent Application No. 10-2011-0036856 filed on Apr. 20, 2011 in the Korean Intellectual Property Office, is incorporated herein by reference in its entirety.

Figure 1:
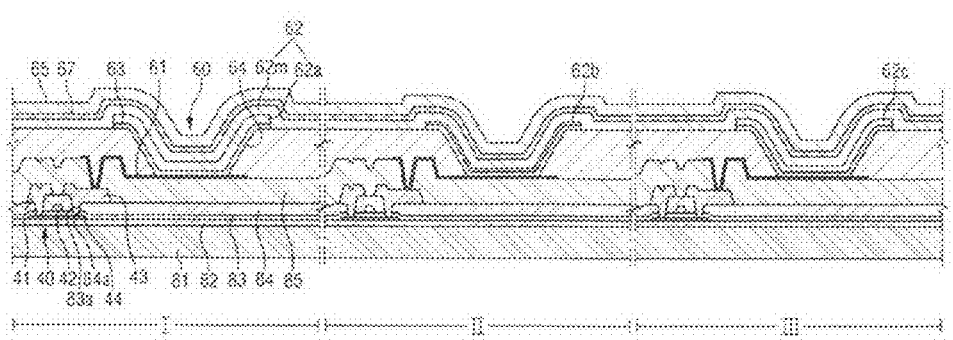
FIG. 1 illustrates a cross-sectional view of an organic light-emitting display device according to an exemplary embodiment.
Figure 2:
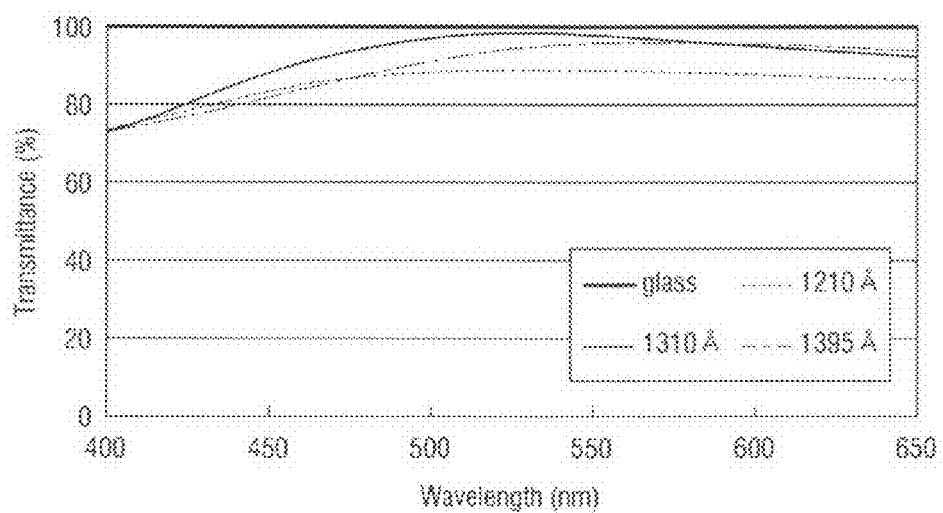
FIG. 2 illustrates a graph for determining a thickness of a cathode electrode that may be applied to the exemplary embodiment of FIG. 1.

Hereinafter, an organic light-emitting display device according to an exemplary embodiment will be described with reference to FIG. 1. FIG. 1 illustrates a cross-sectional view of an organic light-emitting display device according to an exemplary embodiment. FIG. 2 illustrates a graph for determining a thickness of a cathode electrode that may be applied to the exemplary embodiment of FIG. 1.

Referring to FIG. 1, the organic light-emitting display device according to the current exemplary embodiment may include an anode electrode 61, an organic layer 63, and a cathode electrode 62.

As shown in FIG. 1, the organic light-emitting display device according to the current exemplary embodiment may include a substrate 81. The substrate 81 may be made of a transparent material, such as glass, or a plastic material. A buffer layer 82 may be formed on a surface, e.g., whole surface, of the substrate 81. Although not shown in the drawing, a capacitor including a first capacitor electrode and a second capacitor electrode may be formed on the buffer layer 82.

Active layers 44, arranged in a predetermined pattern, may be formed on the buffer layer 82. The active layers 44 may be covered with a gate insulating film 83. The active layers 44 may contain a p- or n-type semiconductor.

A gate electrode 42 of a driving transistor 40 may be formed on the gate insulating film 83 to correspond to each of the active layers 44. The gate electrode 42 may be covered with an intermediate insulating film 84. After the formation of the intermediate insulating film 84, the gate insulating film 83 and the intermediate insulating film 84 may be etched by an etching process, such as a dry-etching process. As a result, contact holes 83a and 84a, exposing portions of each of the active layers 44, may be formed.

The exposed portions of each of the active layers 44 may be connected to a source electrode 41 and a drain electrode 43 of the driving transistor 40, which are formed in a predetermined pattern, by the contact holes 83a and 84a, respectively. The source electrode 41 and the drain electrode 43 may be covered by forming a passivation film 85 thereon. After the formation of the passivation film 85, a portion of the drain electrode 43 may be exposed by an etching process.

The passivation film 85 may be an insulator, e.g., an inorganic film, such as a silicon oxide film or a silicon nitride film, or an organic film made of acryl. However, the materials specifically described herein are merely exemplary, and the material that forms the passivation film 85 is not limited to these materials. Although not shown in the drawing, another insulating film may further be formed on the passivation film 85 to planarize the passivation film 85.

Organic light-emitting display devices according to exemplary embodiments may display image information by emitting red, green and blue light according to the flow of current. More specifically, the organic layer 63 may emit light when supplied with holes from the anode electrode 61 and electrons from the cathode electrode 62. The light emitted from the organic layer 63 may travel, for example, toward the cathode electrode 62 to realize an image over the cathode electrode 62.

The anode electrode 61 may be a pixel electrode connected to the drain electrode 43 of the driving transistor 40. More specifically, the anode electrode 61 may be formed on the substrate 81 and connected to an external power source so as to provide holes to the organic layer 63. The anode electrode 61 may contain at least one material selected from the group consisting of InO, ITO, ZnO, and IZO having a work function whose absolute value is sufficiently high.

The anode electrode 61 may be, for example, a transparent electrode or a reflective electrode. The anode electrode 61, formed as a transparent electrode, may include, e.g., ITO, IZO, ZnO, or $In_2O_3$. The anode electrode 61, formed as a reflective electrode, may include a reflective layer made of, e.g., Ag, Mg, Al, Pt, Pd, Au, Ni, Nd, Ir, Cr, or a compound of these materials, and a transparent electrode layer made of ITO, IZO, ZnO or $In_2O_3$.

The organic layer 63 may be formed between the anode electrode 61 and the cathode electrode 62, and may include an emission layer. In other words, the organic layer 63 may be formed on the anode electrode 61, and may include the emission layer. A pixel defined layer 86 covering the anode electrode 61 may include pixel apertures 64. Each of the pixel apertures 64 may expose a predetermined portion of the anode electrode 61.

The organic layer 63 may be made of a low or high molecular weight organic material. When a low molecular weight organic material is used, at least one hole injection layer, at least one hole transport layer, at least one emission layer, at least one electron transport layer, and at least one electron injection layer may be stacked together to form the organic layer 63. Applicable examples of the organic material that may be used include, but are not limited to, copper phthalocyanine (CuPc), N,N'-Di(naphthalene-1-yl)-N,N'-diphenyl-benzidine (NPB), and tris-8-hydroxyquinoline aluminum (Alq3). The low molecular weight organic material may be formed by, e.g., vacuum deposition.

When the organic layer 63 is made of a high molecular weight organic material, it may include a hole transport layer and an emission layer. In this case, the hole transport layer may be made of poly-(2,4)-ethylene-dihydroxythiophene (PEDOT), and the emission layer may be made of polyphenylene vinylene (PPV) or polyfluorene. Here, the high molecular weight organic material may be formed by screen printing or inkjet printing. The organic layer 63 may be included in an exemplary embodiment, and the materials included in the organic layer 63 are not limited to the materials described herein. Thus, known conventional materials may be used for the organic layer 63, according to various embodiments.

As shown in the drawing, the organic layer 63 may have a uniform thickness across a plurality of pixel regions. The hole injection layer and the hole transport layer of the organic layer 63 may be disposed between the emission layer and the anode electrode 61. The electron transport layer and the electron injection layer of the organic layer 63 may be disposed between the emission layer and the cathode electrode 62. The thicknesses of the hole injection layer, the hole transport layer, the electron transport layer and the electron injection layer, in one of two different pixel regions among the plurality of pixel regions, may be the same as those of their counterparts in the other one of the two different pixel regions. For example, the hole injection layer, the hole transport layer, the electron transport layer and the electron injection layer, may each have the same thickness in two of the different pixel regions.

The cathode electrode 62 may cover all pixels and may be a counter electrode of the anode electrode 61. More specifically, the cathode electrode 62 may be connected to the external power source and, thereby, provide electrons to the organic layer 63.

As described above, an image emitted from the organic layer 63 may be realized in the direction of the cathode electrode 62 only after being transmitted through the cathode electrode 62. Thus, the cathode electrode 62 may be a transparent cathode electrode containing, e.g., indium oxide. The material used as the transparent cathode electrode may have high transmittance in a visible light region, a level of electrical conductivity appropriate for use as an electrode material, and a low work function to facilitate the injection of electrons into an organic material.

The cathode electrode 62 may have different thicknesses in a first region and a second region. For example, the thickness of the cathode electrode 62 in the second region may be different from that of the cathode electrode 62 in the first region.

According to an embodiment, the substrate 81 may include a plurality of pixel regions. The cathode electrode 62 may have different thicknesses in at least two of the pixel regions. By forming the cathode electrode 62 to have different thicknesses in some regions as described above, the light transmittance of the cathode electrode 62 may be increased. For example, the cathode electrode 62 may have a light transmittance of approximately 75% or higher, more desirably, approximately 85% or higher.

More specifically, the pixel regions may include a first pixel region I, a second pixel region II, and a third pixel region III. The cathode electrode 62 may have a first thickness in the first pixel region I, a second thickness in the second pixel region II, and a third thickness in the third pixel region III. The first through third thicknesses may be different from each other. For example, one or more of the first through third thicknesses may be different from one or more other of the first through third thicknesses. In an implementation, at least two of the first through third thicknesses of the cathode electrode 62 may be different from each other. For example, two of the first through third thicknesses may be the same, and only one of them may be different. According to an embodiment, the first thickness and the second thickness may be the same, and the third thickness may be different. In another embodiment, all of the first through third thicknesses may be different from each other. In FIG. 1, the first through third thicknesses are different from each other. However, only an exemplary embodiment is shown, and various modifications may be made to the embodiments described herein.

As shown in FIG. 1, the cathode electrode 62 may include a common cathode electrode 62m and a plurality of partial cathode electrodes 62a through 62c. The common cathode electrode 62m may cover all of the anode electrode 61 and the organic layer 63, and each of the partial cathode electrodes 62a through 62c may be formed between the common cathode electrode 62m and the organic layer 63.

The substrate 81 may include a plurality of pixel regions, and the anode electrode 61 may be patterned to correspond to each of the pixel regions. Similarly, the partial cathode electrodes 62a through 62c may correspond to the plurality of pixel regions, respectively. For example, the anode electrode 61 may be patterned to correspond to each of the plurality of pixel regions; and each of the partial cathode electrodes 62a through 62c may be formed on the patterned anode electrode 61. Accordingly, the patterned anode electrode 61 and each one of the partial cathode electrodes 62a through 62c may correspond to a respective pixel region.

In an implementation, the patterned anode electrode 61 may correspond to each of the partial cathode electrodes 62a through 62c, and the organic layer 63 may be formed between them. The emission layer included in the organic layer 63 may emit light of a wavelength that a corresponding pixel region intends to emit. The organic layer 63 may, for example, emit red light.

The common cathode electrode 62m may electrically connect the partial cathode electrodes 62a through 62c. The common cathode electrode 62m may be formed to have a uniform thickness. Accordingly, the partial cathode electrodes 62a through 62c may be formed to have different thicknesses. In other words, the common cathode electrode 62m may have a uniform thickness across the pixel regions; and the partial cathode electrodes 62a through 62c may have different thicknesses in at least two of the pixel regions. Accordingly, the cathode electrode 62 may have different thicknesses in at least two of the pixel regions. That is, the thickness of the cathode electrode 62 may be adjusted according to the thickness of each of the partial cathode electrodes 62a through 62c.

The thickness of the cathode electrode 62 may be determined based on the correlation between the wavelength of light that passes through the cathode electrode 62 and the transmittance of the light that passes through the cathode electrode 62.

Referring to FIG. 2, the transmittance of light (the y-axis) that passed through an indium oxide layer having thicknesses of 1210 Å, 1310 Å and 1395 Å was measured with respect to the wavelength of the light (the x-axis). The transmittance of light that passed through a glass substrate was 100% at all wavelengths. On the other hand, even when the indium oxide layer had a uniform thickness, the transmittance of light varied according to the change in the wavelength of the light.

For example, in a region in which light has a wavelength of 430 nm or less, the transmittance of the light was 80% or less for all of the thicknesses of 1210 Å, 1310 Å, and 1395 Å. In a region after approximately 430 nm, the transmittance of the light for the thickness of 1310 Å was higher than that for the thicknesses of 1210 Å and 1395 Å. After approximately 570 nm, the transmittance of the light was relatively higher for the thickness of 1395 Å than for the thickness of 1310 Å.

Therefore, the thickness of the cathode electrode 62 may be determined to be a thickness that ensures or facilitates highest light transmittance at a wavelength of light emitted from each pixel region. In FIG. 2, the light transmittance of the indium oxide layer with respect to the wavelength of light is shown. However, the thickness of the cathode electrode 62 that ensures highest light transmittance may also vary according to the material that forms the cathode electrode 62. For example, the thickness of the cathode electrode 62 may be determined both in view of the correlation between the wavelength of light that passes through the cathode electrode 62 and the transmittance of the light through the cathode electrode 62 and in view of the material that forms the cathode electrode 62.

To form the cathode electrode 62 having different thicknesses, the thicknesses of the partial cathode electrodes 62a through 62c may be adjusted. In other words, the thickness of the cathode electrode 62 may be defined as the sum of the thickness of the common cathode electrode 62m and each of the thicknesses of the partial cathode electrodes 62a through 62c. Therefore, when the common cathode electrode 62m has a uniform thickness, the partial cathode electrodes 62a through 62c may be formed to have different thicknesses. The cathode electrode 62 having different thicknesses may, thereby, be formed.

Referring to FIG. 1, the partial cathode electrode 62a in the first pixel region I, the partial cathode electrode 62b in the second pixel region II, and the partial cathode electrode 62c in the third pixel region III may have different thicknesses. Accordingly, although the common cathode electrode 62m having a uniform thickness is formed on the partial cathode electrodes 62a through 62c of the first through third pixel regions I through III, the cathode electrode 62 may have a different thickness in each of the first through third pixel regions I through III.

As described above, an appropriate thickness of the cathode electrode 62 in each pixel region may ensure the highest light transmittance at the wavelength of light emitted from the corresponding pixel region. As such, the thickness of the cathode electrode 62 may be adjusted according to the wavelength of light emitted from each pixel region. Thus, light transmittance of each pixel region may be maximized, thereby increasing light efficiency.

Each of the partial cathode electrodes 62a through 62c may correspond to the anode electrode 61 that is patterned to correspond to each of the pixel regions. As such, the partial cathode electrodes 62a through 62c may correspond to the pixel regions, respectively. Further, if the partial cathode electrodes 62a through 62c are formed by, e.g., a thermal evaporation process, a mask for pixel deposition may be used.

In FIG. 1, the first through third pixel regions I through III are illustrated as the pixel regions. However, pixel regions in addition to the first through third pixel regions I through III may be provided. For example, if the first through third pixel regions I through III emit light of different colors, one or more additional pixel regions, e.g., fourth, fifth, and sixth pixel regions, emitting light of other different colors may be added. In addition, at least two of the first through third pixel regions I through III may emit light of the same color.

The anode electrode 61 and the cathode electrode 62 may be insulated from each other and cause the organic layer 63 to emit light by applying voltages of different polarities to the organic layer 63. As described above, the anode electrode 61 may be patterned to correspond to each pixel region. In addition, the cathode electrode 62 may cover all pixels.

According to one or more embodiments, the light transmittance of the cathode electrode 62 may be significantly increased. Thus, luminous efficiency may be increased even without applying a resonance structure. Accordingly, viewing angle characteristics may be improved, and an optical structure, e.g., resonance structure, may be excluded from the design of the organic light-emitting display device.

As shown in FIG. 1, an auxiliary electrode layer 67 and a bus electrode line 65 may be formed on the cathode electrode 62. The auxiliary electrode layer 67 and the bus electrode line 65 may be formed of, e.g., ITO, IZO, ZnO or $In_2O_3$. In a broad sense, the auxiliary electrode layer 67 and the bus electrode line 65 may be collectively referred to as the cathode electrode 62. As used herein, however, a thin film formed on the organic layer 63 may be the cathode electrode 62. Such use of the term is intended to describe the embodiments more clearly, e.g., clearly distinguish between elements, and allow one of ordinary skill in the art to understand that the cathode electrode 62 is distinguishable from the auxiliary electrode layer 67 and the bus electrode line 65.

Although not shown in the drawings for simplicity, another passivation film may further be formed on the cathode electrode 62.

Figure 3:
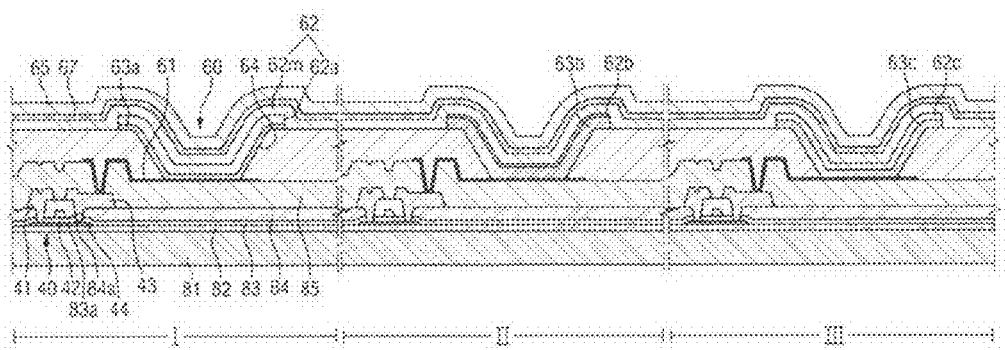
FIG. 3 illustrates a cross-sectional view of an organic light-emitting display device according to another exemplary embodiment.

Hereinafter, an organic light-emitting display device according to another exemplary embodiment will be described with reference to FIG. 3. FIG. 3 is a cross-sectional view of an organic light-emitting display device according to another exemplary embodiment.

The organic light-emitting display device according to the current exemplary embodiment may be the same as the organic light-emitting display device according to the previous exemplary embodiment except that an organic layer in the organic light-emitting display device, according to the current exemplary embodiment, may have a different thickness in at least two of a plurality of pixel regions. For simplicity, elements of the current exemplary embodiment, which are substantially identical to those of the previous exemplary embodiment, are indicated by like reference numerals. As such, their description will be omitted or simplified.

Referring to FIG. 3, the organic light-emitting display device according to the current exemplary embodiment may include a substrate 81 having a plurality of pixel regions I through III defined therein. The substrate 81 may included an anode electrode 61, an organic layer 63a through 63c, and a cathode electrode 62, formed thereon.

The pixel regions I through III may be defined in the substrate 81, and the cathode electrode 62 may have different thicknesses in at least two of the pixel regions I through III. As described above, the thickness of the cathode electrode 62 may be determined in view of or based on light transmittance with respect to the wavelength of light emitted from a corresponding pixel region.

The organic layer 63a through 63c may have different thicknesses in at least two of the pixel regions I through III. As described above, the organic layer 63a through 63c may include an emission layer, a hole injection layer and a hole transport layer. The hole injection layer and the hole transport layer may be formed between the emission layer and an anode electrode 61. The organic layer 63 may also include and an electron transport layer and an electron injection layer formed between the emission layer and the cathode electrode 62. The emission layer of the organic layer 63a through 63c may have different thicknesses. Further, at least one of the hole injection layer, the hole transport layer, the electron transport layer and the electron injection layer may have different thicknesses.

Since the thickness of the organic layer 63a through 63c and the thickness of the cathode electrode 62 may be determined for each pixel as described above, the light-emitting efficiency of the organic light-emitting device may further be improved.

Embodiments provide an organic light-emitting display device structured to improve light-emitting efficiency using a transparent cathode electrode without applying a resonance structure when realizing an image in the direction of the cathode electrode.

What is claimed is:

1. An organic light-emitting display device, comprising:
an anode electrode;
an organic layer on the anode electrode, the organic layer having an emission layer; and
a cathode electrode on the organic layer, the cathode electrode including a common cathode electrode covering the anode electrode and the organic layer, and a plurality of partial cathode electrodes on the common cathode electrode,
wherein a thickness of the cathode electrode in a first region is different from a thickness of the cathode electrode in a second region.

2. The display device of claim 1, wherein:
the common cathode electrode covers all of the anode electrode and the organic layer; and
the plurality of partial cathode electrodes are between the common cathode electrode and the organic layer.

3. The display device as claimed in claim 1, further comprising a substrate having a plurality of pixel regions, wherein the anode electrode is patterned to correspond to each of the plurality of pixel regions, and each of the partial cathode electrodes corresponds to a respective pixel region.

4. The display device as claimed in claim 3, wherein the common cathode electrode has a uniform thickness throughout the pixel regions.

5. The display device as claimed in claim 3, wherein the partial cathode electrodes in at least two of the pixel regions have different thicknesses.

6. The display device as claimed in claim 1, further comprising a substrate having a plurality of pixel regions, wherein the cathode electrode has different thicknesses in at least two of the plurality of pixel regions.

7. The display device as claimed in claim 6, wherein the pixel regions comprise first through third pixel regions, wherein the cathode electrode has a first thickness in the first pixel region, a second thickness in the second pixel region, and a third thickness in the third pixel region, wherein the first through third thicknesses are different.

8. The display device as claimed in claim 6, wherein the thickness of the cathode electrode formed in each pixel region is determined based on a wavelength of light that passes through the cathode electrode and transmittance of the light that passes through the cathode electrode.

9. The display device as claimed in claim 8, wherein the transmittance of the light that passes through the cathode electrode in each pixel region is 85% or higher.

10. The display device as claimed in claim 6, wherein the organic layer has different thicknesses in at least two of the pixel regions.

11. The display device as claimed in claim 6, wherein the organic layer has a uniform thickness throughout the plurality of pixel regions.

12. The display device as claimed in claim 11, wherein the organic layer further comprises a hole injection layer and a hole transport layer between the emission layer and the anode electrode, and an electron transport layer and an electron injection layer between the emission layer and the cathode electrode, wherein the hole injection layer, the hole transport layer, the electron transport layer, and the electron injection layer, each have a thickness that is the same in the at least two of the plurality of pixel regions.

13. An organic light-emitting display device, comprising:
a substrate in which a plurality of pixel regions are defined;
an anode electrode on the substrate;
an organic layer on the anode electrode and having an emission layer; and
a cathode electrode on the organic layer, the cathode electrode including a plurality of partial cathode electrodes, each of the plurality of cathode electrodes corresponding to a respective pixel region, and a common cathode electrode,
wherein the cathode electrode has different thicknesses in at least two of the pixel regions.

14. The display device of claim 13, wherein:
the anode electrode is patterned to correspond to each of the plurality of pixel regions, and
the common cathode electrode is electrically connected to the partial cathode electrodes.

15. The display device as claimed in claim 13, wherein the common cathode electrode has a uniform thickness throughout the plurality of pixel regions.

16. The display device as claimed in claim 13, wherein the pixel regions comprise first through third pixel regions, wherein the cathode electrode has a first thickness in the first pixel region, a second thickness in the second pixel region, and a third thickness in the third pixel region, wherein the first through third thicknesses are different.

17. The display device as claimed in claim 13, wherein the thickness of the cathode electrode in each pixel region is determined based on a wavelength of light that passes through the cathode electrode and transmittance of the light that passes through the cathode electrode.

18. The display device as claimed in claim 17, wherein the transmittance of the light that passes through the cathode electrode in each pixel region is 85% or higher.

19. The display device as claimed in claim 13, wherein the organic layer has different thicknesses in at least two of the pixel regions.

20. The display device as claimed in claim 13, wherein the organic layer has a uniform thickness throughout the plurality of pixel regions.

21. The display device as claimed in claim 20, wherein the organic layer comprises a hole injection layer and a hole transport layer between the emission layer and the anode layer, and an electron transport layer and an electron injection layer between the emission layer and the cathode electrode, wherein the hole injection layer, the hole transport layer, the electron transport layer, and the electron injection layer, each have a thickness that is the same in the at least two of the plurality of pixel regions.

* * * * *